(12) United States Patent
Frosien

(10) Patent No.: US 7,326,927 B2
(45) Date of Patent: Feb. 5, 2008

(54) FOCUSING LENS AND CHARGED PARTICLE BEAM DEVICE FOR TITLED LANDING ANGLE OPERATION

(75) Inventor: Jürgen Frosien, Riemerling (DE)

(73) Assignee: ICT Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 302 days.

(21) Appl. No.: 11/249,772

(22) Filed: Oct. 13, 2005

(65) Prior Publication Data

US 2006/0097184 A1    May 11, 2006

(30) Foreign Application Priority Data

Oct. 14, 2004    (EP) .................................. 04024521

(51) Int. Cl.
*G21G 5/00* (2006.01)

(52) U.S. Cl. .................. 250/310; 250/311; 250/396 R; 250/396 ML

(58) Field of Classification Search ................ 250/310, 250/311, 396 R, 396 ML
See application file for complete search history.

(56) References Cited

U.S. PATENT DOCUMENTS 3,736,422 A    5/1973    Weber et al.

7,034,297 B2 *    4/2006    Petrov et al. ................ 250/310
2001/0011702 A1    8/2001    Yonezawa et al.

FOREIGN PATENT DOCUMENTS

| EP | 0335398 | 10/1989 |
|----|---------|---------|
| EP | 0732726 A | 9/1996 |

* cited by examiner

*Primary Examiner*—Jack I. Berman
*Assistant Examiner*—Michael J Logie
(74) *Attorney, Agent, or Firm*—Patterson & Sheridan, LLP

(57) ABSTRACT

The present invention relates to a focusing lens, a charged particle beam device, and a method for focusing a charged particle beam onto a specimen, wherein the focusing lens comprises an auxiliary electrode having an essentially planar electrode surface for focusing the charged particle beam at a tilted landing angle, wherein the essentially planar electrode surface includes an auxiliary electrode angle with the optical axis of the focusing lens that is smaller than 80 degrees. With such a focusing lens, it is possible to operate a charged particle beam device at a tilted landing angle where focusing field distortions, caused by the tilted landing angle, are reduced.

55 Claims, 6 Drawing Sheets

FOCUSING LENS AND CHARGED PARTICLE BEAM DEVICE FOR TITLED LANDING ANGLE OPERATION

FIELD OF THE INVENTION

This application claims priority to European Patent Application No. EP 04024521.9 filed on Oct. 14, 2004, and is incorporated herein by reference.

The invention relates to a focusing lens used for focusing a charged particle beam onto a specimen at a tilted landing angle. Further, the invention relates to a charged particle beam device for focusing a charged particle beam onto a specimen at a tilted landing angle, and a method for inspecting or structuring a specimen by means of a charged particle beam.

BACKGROUND OF THE INVENTION

Progress in microelectronics, material science, biology and related fields depends on an ever increasing spatial resolution and throughput for the inspection and structuring of the respective specimens. At present, a high spatial resolution can best be achieved with charged particle beam devices such as electron microscopes, focused ion beam devices or electron beam pattern generators that are capable of focusing probing charged particle beams to a sufficiently small focus spot size. Focusing a charged particle beam to a small spot size, however, requires tight control of the focusing electric and/or magnetic fields.

In recent years, it has been recognized that inspections or structuring of micrometer size structures, or below, greatly profit from an operation where the probing or structuring charged particle beam impinges onto a specimen at a tilted landing angle, i.e. at an angle smaller than 90 degrees. Operation at a tilted landing angle can be achieved, for example, by tilting the specimen, tilting the beam optical column, or deflecting the charged particle beam with respect to the specimen.

Unfortunately, as it turns out, focusing the charged particle beam at a tilted landing angle can lead to a deformation or deflection of the charged particle beam in cases where electrical fields are present between focusing lens (objective lens) and the specimen. This in turn may cause image shifts and/or reduced spatial resolution.

SUMMARY OF THE INVENTION

It is, therefore, a first aspect of the present invention to provide for an improved focusing lens, an improved charged particle beam device and an improved method of inspecting or structuring a specimen with a higher spatial resolution.

In particular, it is a further aspect of the present invention to provide for a focusing lens and a charged particle beam device and a method that facilitates an inspection or structuring of a specimen at a tilted landing angle with a high spatial resolution.

It is yet a further aspect of the present invention to provide for a charged particle beam device that is capable of inspecting or structuring a specimen at a tilted landing angle with a high spatial resolution at reasonable costs.

It is yet a further aspect of the present invention to provide for a charged particle beam device that is capable of inspecting or structuring a specimen at different, at least two, landing angles with a high spatial resolution.

This and other advantages are achieved by the focusing lens according one or more embodiments.

Further advantages, features and aspects of the invention are evident from the claims, the description and the accompanying drawings. The claims are intended to be understood as a first non-limiting approach for defining the invention in general terms.

In one embodiment, the focusing lens includes an auxiliary electrode having an essentially planar electrode surface. With the essentially planar electrode surface, it is possible to compensate for distortions of the charged particle beam caused by the tilted orientation of specimens like semiconductor wafers or chips. In particular, with the auxiliary electrode angle between said essentially planar electrode surface and optical axis of less than 80 degrees, it is possible to efficiently compensate for distortions of the charged particle beam that are caused when operating the charged particle beam at tilted landing angles equal or smaller than 80 degrees. The landing angle refers to the angle at which the charged particle beam impinges onto the specimen while the auxiliary electrode angle refers to the angle between the essentially planar electrode surface of the auxiliary electrode and the optical axis.

With the auxiliary electrode angle smaller than 80 degrees, it can be ensured that distortions of the charged particle beam due to the tilted landing angle operation become best compensated for landing angles that are smaller than 80 degrees. Further, for inspecting or structuring a specimen at a landing angle of less than 60 degrees or even less than 50 degrees, it is preferred to have the auxiliary electrode angle smaller than, respectively, 60 degrees or 50 degrees. This is because it has been found that the compensation is most efficient if the landing angle essentially equals the auxiliary electrode angle.

In general, the present invention is based on the observation that the spatial resolution of a focusing charged particle beam device deteriorates if the landing angle is not orthogonal with respect to the surface of the specimen. The invention is further based on the discovery that the deterioration of the spatial resolution is due to a deformation of the charged particle beam caused by the focusing electric field between the focusing lens and the specimen. The present invention is further based on the idea to compensate for the deformation of the charged particle beam by equipping the focusing lens with an auxiliary electrode. Further, it was found that the deformation of the charged particle beam can be particularly well compensated if the auxiliary electrode has an essentially planar electrode surface, despite the common belief that only coaxially shaped electrodes provide for a good focusing.

In one embodiment, the focusing lens includes a first electrode having an aperture for focusing the charged particle beam. In one embodiment, the aperture defines the position and direction of the optical axis of the focusing lens. Further, preferably, the auxiliary electrode is positioned and oriented to provide that its essentially planar electrode surface faces the first electrode. This way, the essentially planar electrode surface and the tilted surface of the specimen can provide for a fourfold symmetry with respect to the optical axis that helps to reduce deflection and deformation of the charged particle beam due to the tilted surface of the specimen.

In order to provide for a fourfold symmetry, the essentially planar electrode surface of the auxiliary electrode is preferably aligned to be orthogonal with respect to a tilting plane extending along the optical axis. In one embodiment, the tilting plane is the plane within which the optical axis of the focusing lens is tilted. In this case, if the focusing lens is operated at a landing angle that equals the auxiliary electrode angle, the surface of the specimen and the essentially planar electrode surface can be made symmetric with respect to a symmetry plane that extends along the optical axis and bisects the angle enclosed by the essentially planar electrode surface and the surface of the specimen. In this case, the symmetry plane acts as a symmetry plane for the focusing electric field to reduce beam deflection and beam deformation.

In another embodiment, the focusing lens includes at least two correction electrodes. The at least two correction electrodes can be used to compensate for higher order distortions of the charged particle beam, like astigmatism, induced by the auxiliary electrode and the tilted orientation of the surface of the specimen. Preferably, the at least two correction electrodes are positioned to be symmetric with respect to the tilting plane. In yet another embodiment, each of the at least two correction electrodes is symmetric with respect to the symmetry plane.

In another embodiment, the correction electrodes are each tilted to include a correction electrode angle with respect to the tilting plane. In yet another embodiment, the correction electrode angle is such that the correction electrode is oriented to point towards the angular point of the auxiliary electrode angle. In another embodiment, the angular point of the auxiliary electrode angle is the point where the charged particle beam interacts with the specimen. In this case, the specimen surface, essentially planar surface of the auxiliary electrode and the two correction electrodes, can be made to define a four sided pyramid whose tip corresponds to the angular point of the auxiliary electrode angle and whose central line coincides with the optical axis. Even more preferred, the correction electrode angle essentially equals the auxiliary electrode angle in size to improve the symmetry with respect to the optical axis.

In another embodiment, the at least two correction electrodes have the same shape. In yet another embodiment, the at least two correction electrodes have a pin-like shape pointing towards the angular point of the auxiliary electrode angle. In another preferred embodiment, the correction electrodes have a planar surface facing the first electrode to better reduce deflection and higher order distortions of the charged particle beam.

In another embodiment, the auxiliary electrode has multiple through-holes that enable secondary charged particles to pass through the auxiliary electrode. In this way, secondary charged particles generated by the charged particle beam on the specimen can be detected by an external detector placed behind the auxiliary electrode. The realization of an auxiliary electrode having an essentially planar electrode surface and multiple through holes are manifold. For example, the auxiliary electrodes can be made of a plate-like structure having the multiple through-holes etched or drilled, it may be a plate-like grid, or a plate-like structure formed of a mesh of conducting threads.

In another embodiment, a charged particle beam device is described.

In another embodiment, the focusing lens is held at a fixed position to provide for a fixed tilted landing angle when inspecting or structuring the surface of the specimen. In this case, it is preferred to have the auxiliary electrode at a fixed auxiliary electrode angle that equals the landing angle. A fixed tilted landing angle charged particle beam device is simple to manufacture and to operate.

In another embodiment, the charged particle beam device has a tilting mechanism for operating the charged particle beam at various landing angles. This can be achieved, for example, by tilting the specimen, tilting the focusing lens or by deflecting the charged particle beam with respect to the specimen. In this case, it is preferred that the auxiliary electrode is equipped with auxiliary electrode angle adjustment means that are capable of tilting the auxiliary electrode with respect to the optical axis for an adjustment of the auxiliary electrode angle to various landing angles. Further in this case, it is preferred that the auxiliary electrode angle adjustment means are capable of tilting the auxiliary electrode away from the focusing region when operating the charged particle beam at a landing angle of 90 degrees.

BRIEF DESCRIPTION OF THE DRAWINGS

Some of the above indicated and other more detailed aspects of the invention will be described in the following description and partially illustrated with reference to the figures. Therein:

FIG. 3b: A schematic cross sectional front view of the focusing lens of FIG. 3a.

DESCRIPTION OF THE PREFERRED EMBODIMENTS

Figure 1:
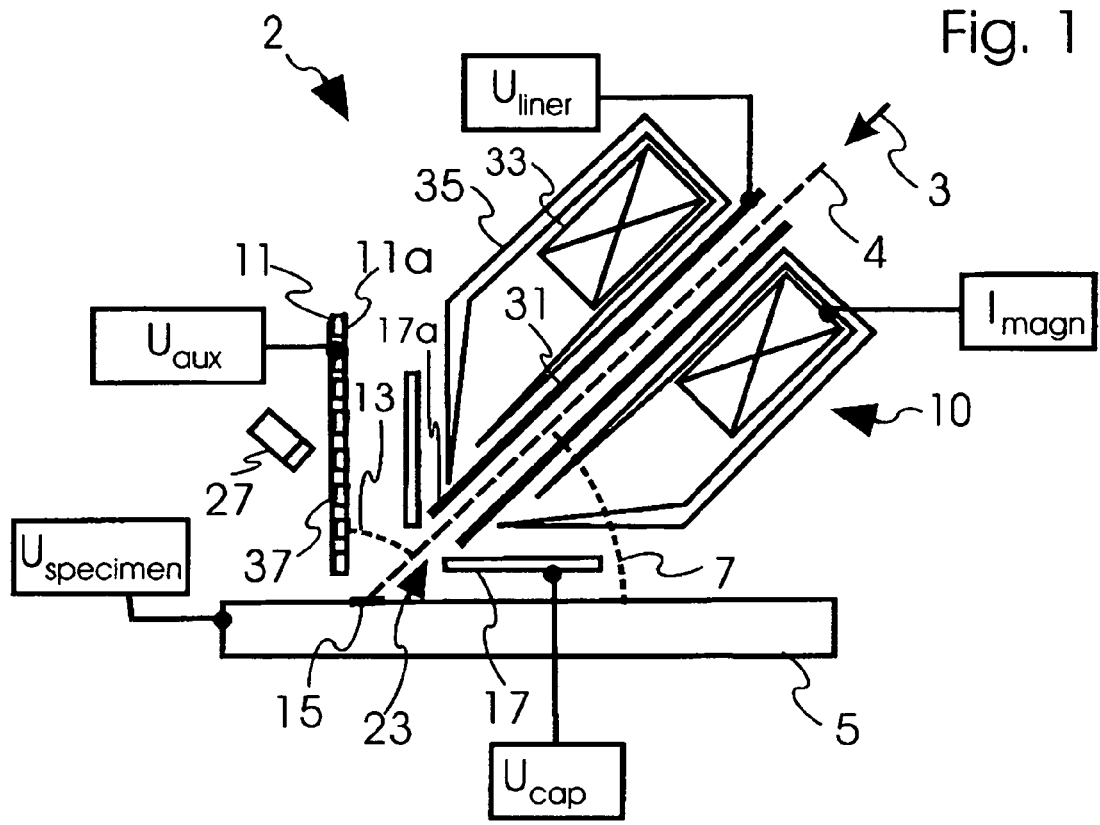
FIG. 1: A first focusing lens for focusing a charged particle beam at a tilted landing angle onto a specimen having a first electrode, a second electrode and a magnetic focusing lens, and an auxiliary electrode.

In the description of the embodiments, the numbers refer to the numbers that label the features of the enclosed figures FIGS. 1, 2, 3a-c, and 4a-b. The figures represent only particular, non-limiting embodiments of the invention which have the purpose of being only illustrative examples of the invention.

The present invention refers to a focusing lens that can be used for the operation of charged particle beam devices. Charged particle beam device is used as a generic term for devices that can focus a charged particle beam for inspecting or structuring a specimen. The focusing lens, according to an embodiment, can be used for focusing a charged particle beam at a tilted landing angle, i.e. at landing angles smaller than 90 degrees, which is useful for electron microscopes used to inspect a specimen, for focusing ion beam devices to structure a specimen, for electron beam pattern generators to structure a mask, and the like.

The term "focusing lens" used in another embodiment and the description may refer to lenses that are capable of providing a focusing electric and, possibly, a magnetic field for focusing a beam of charged particles onto a specimen. Charged particles, in this case, may be electrons, ions, protons and the like. The specimen referred to in the claims and the description may be any object that is to be inspected or structured by the charged particle beam, e.g. a semiconductor wafer, a mask that is to be structured by the charged particle beam, biological specimens that are to be inspected, and the like.

The term "landing angle" used another embodiment and the description may refer to the angle between the incoming charged particle beam and the surface of the specimen. A "tilted landing angle" may refer to a landing angle that is smaller than 90 degrees.

The term "essentially" of the essentially planar electrode surface 11a of auxiliary electrode 11 may refer to the fact that the macroscopic curvature radii of the essentially planar electrode surface 11a, in any direction, may be larger than ten times, or larger than 100 times and even larger than 1000 times the curvature radius of the aperture 23 of the first electrode 17. This makes sure that the charged particle beam "sees" the electric potential of an essentially planar electrode surface 11a when leaving the small aperture 23 of first electrode 17 towards specimen 3. Note that the macroscopic curvature radii of the essentially planar electrode surface do not refer to the microscopic curvature radii that describe the roughness or texture of the electrode surface 11a.

FIG. 1 schematically illustrates a cross section through a focusing lens 2 according to an embodiment. With the exception of auxiliary electrode 11, the focusing lens type of FIG. 1 has been described in detail, for example, in "*High Precision electron optical system for absolute and CD-measurements on large substrates*" by J. Frosien, S. Lanio, H. P. Feuerbaum in "*Nuclear Instruments and Methods in Physics Research*" A363 (1995) pp. 25-30, which is herewith enclosed into the description.

FIG. 1 shows focusing lens 2 while focusing a charged particle beam 3 at a tilted landing angle 7 onto specimen 5 for inspecting the surface of the specimen. The landing angle 7 is defined as the angle at which the charged particle beam 3 impinges onto the surface of the specimen, which corresponds to the angle between optical axis 4 of focusing lens 2 and surface of the specimen 5. The focusing of the charged particle beam 3, in this case an electron beam, is carried out by the focusing electric field generated by first voltage source $U_{cap}$ connected to first electrode 17, the second voltage source $U_{liner}$ connected to second electrode 17a, specimen voltage source $U_{specimen}$ connected to specimen 5. Auxiliary voltage source $U_{aux}$ is connected to auxiliary electrode 11 in order to compensate for beam distortions caused by the tilted landing angle operation. Charged particle beam 3 of FIG. 1 is further focused by a magnetic focusing field generated by magnetic focusing lens 10 having focusing coil 33 and focusing yoke 35. Focusing coil 33 is connected to a current source $I_{magn}$.

First electrode 17, second electrode 17a and yoke 35 are coaxially aligned with respect to optical axis 4 in order to generate rotational symmetric electric and magnetic fields along the optical axis 4. In this way, the charged particle beam can be focused without distorting or bending the charged particle beam 3. In another embodiment, first electrode 17 in FIG. 1 is shaped as a cone-like shaped "cap" that is truncated at the tip to provide for an aperture 23 for the focusing of the charged particle beam 3. With the cone-like shape, it is possible to tilt the focusing lens with respect to specimen 5 while maintaining a short working distance between specimen 5 and first electrode 17.

Second electrode 17a of FIG. 1, also known as liner tube, has a tube-like structure in order to accelerate the incoming charged particle beam 3 to a high energy on its way from the charged particle beam source to focusing lens 2. Depending on the voltages of the specimen 5, first electrode 17 and liner tube 17a, the focusing electric field of focusing lens 2 is usually primarily formed between aperture 23 and the lower end of liner tube 17a. However, a significant focusing electric field may also be present between first electrode and the specimen due to a leaking field or due to a voltage difference between the specimen and first electrode (cap voltage).

At a tilted landing angle beam operation, the surface of specimen 5 is not rotational symmetric aligned with respect to optical axis 4. As a consequence, and without auxiliary electrode 11, charged particle beam 3 on its way to the specimen would be deflected and distorted, thereby producing image shifts and coma. With auxiliary electrode 11 and its essentially planar surface 11a facing first electrode 17, however, deflections and distortions of the charged particle beam 3 due to the tilted surface of specimen 5 are compensated. In particular, the best compensation with auxiliary electrode 11 is achieved if, as shown in FIG. 1, auxiliary electrode angle 13 equals landing angle 7, if angular point 15 of auxiliary electrode angle 13 coincides with angular point of landing angle 7, if auxiliary electrode angle 13 and landing angle 7 lie within the same tilting plane 8 (see FIG. 3c), and if essentially planar electrode surface 11a and surface of the specimen 5 are symmetric with respect to symmetry plane 25 (see FIG. 3c) that is orthogonal to tilting plane 8.

Note that, while the auxiliary electrodes 11 of the figures disclosed within the description are essentially plate-like structures, other structures that provide for an essentially planar electrode surface 11a facing the first electrode 17 can equally compensate for beam deflections or distortions. This is because it is mainly the electrode surface 11a facing the first electrode 17 that determines the shape of the focusing field near the optical axis 4.

Further, it should be noted that, while first electrode 17 of the focusing lens 2 in FIG. 1 is cone-like shaped, this is not a requirement for a good beam distortion compensation. First electrode 17 may also be, e.g., a plane electrode having an aperture 23. However, at a tilted landing angle operation, a cone-like shaped first electrode 17 allows for a shorter working distance than, say, a flat first electrode, since the apex of the cone-like shaped first electrode 17 can be moved closer to the surface of specimen 5 without touching the specimen. Since a short working distance helps to improve the spatial resolution, it is generally preferred that apex half-angle 19 of first electrode 17 is equal or smaller than auxiliary electrode angle 13.

Further, note that in FIG. 1, auxiliary electrode 11 has multiple through-holes 37 through which backscattered or secondary charged particles generated by the primary charged particle beam on specimen 5 can pass. With multiple through-holes 37, it is possible to detect secondary charged particles behind auxiliary electrode 11, where more space is left for placing a secondary particle detector 27. This way, secondary charged particles can be detected that, without the multiple through-holes, would hit the auxiliary electrode 11 and remain undetected. Generally, a person skilled in the art will know how large the through-holes 37 of an auxiliary electrode 11 can be and how many through-holes are needed for a given application in order to balance the requirements for a high transparency for secondary charged particles with the requirement of correcting the focusing electric field. Accordingly, depending on the application, the auxiliary electrode 11 with multiple through-holes 37 may be made from a fine wire mesh, a multiply pierced metal plate, a grid, or the like.

Generally, the operation of the focusing lenses, according to another embodiment is similar to known focusing lenses without auxiliary electrode 11, which, for example, is described in the above mentioned article by J. Frosien et al. The operation of auxiliary electrode 11 whose voltage is provided by auxiliary voltage source $U_{aux}$ depends on the application. For example, if the landing angle 7 equals the auxiliary electrode angle 13, the specimen voltage and auxiliary electrode voltage may be the same, since in this case, an undesired deflection of a primary electron beam 3 due to the tilted surface of the specimen 5 is compensated by the same potential of auxiliary electrode 11. In this case, it may be useful to connect specimen 5 and auxiliary electrode 11 to the same voltage source. On the other hand, in order to guide backscattered or secondary charged particles through the multiple through-holes 37 towards external secondary charged particle detector 27, it may be advantageous to apply a somewhat more positive voltage to auxiliary electrode 11. In a further operational mode, it may be advantageous to apply a negative voltage of, say, 30 to 50 V to auxiliary electrode 11 with respect to specimen 5 in order to prevent secondary electrons from traversing through the multiple through-holes 37. In this way, auxiliary electrode 11 can serve as a filter to filter out secondary electrons, which by definition have an energy of less than 50 eV, from the flux of back-scattered electrons that typically have an energy close to the primary electron beam energy.

Figure 2:
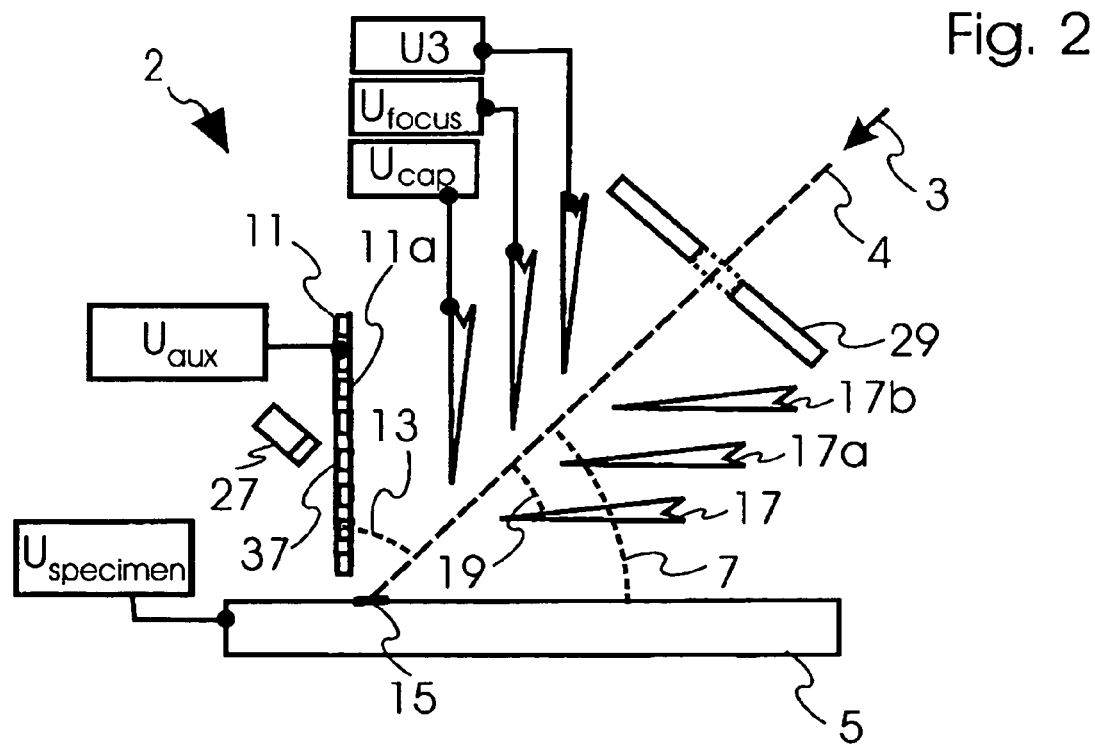
FIG. 2: A second focusing lens for focusing a charged particle beam at a tilted landing angle onto a specimen having a first electrode, a second and a third electrode, and an auxiliary electrode.

FIG. 2 discloses schematically a second focusing lens 2 according to another embodiment. FIG. 2 differs from the focusing lens 2 of FIG. 1 mainly in that the focusing lens 2 does not have a magnetic focusing lens, the second electrode 17a does not have a tube-like structure but a cone-like shape, and that a third electrode 17b connected to a third voltage source U3 is provided. Preferably, each of the three electrodes 17, 17a, 17b is connected to individual voltage sources, i.e., respectively, to first voltage source $U_{cap}$, to second voltage source $U_{focus}$, and to third voltage source U3, to individually control voltages of the electrodes. Note that focusing lens 2 of FIG. 2 has an internal secondary particle detector 29 near optical axis 4 to detect secondary particles generated by the charged particle beam 4 on specimen 5 with a high detection efficiency. The use of internal secondary particle detectors 29 is well-known in the art and is described, for example, in the above mentioned reference by J. Frosien et al.

Note that the set-up of FIG. 1 has two detectors for detecting secondary particles, internal particle detector 29 (not shown) for detecting small angle backscattered/secondary electrons that pass through electrostatic focusing lens 9 at a small angle with respect to optical axis 4, and external particle detector 27 (external detector) for detecting wide angle secondary electrons that pass through the multiple through-holes 37 of auxiliary electrode 11 at a large angle with respect to optical axis 4. In this case, internal particle detector 29 provides for information on the material of the specimen while external particle detector 27 provides for information on the topography of the specimen.

Figure 3A:
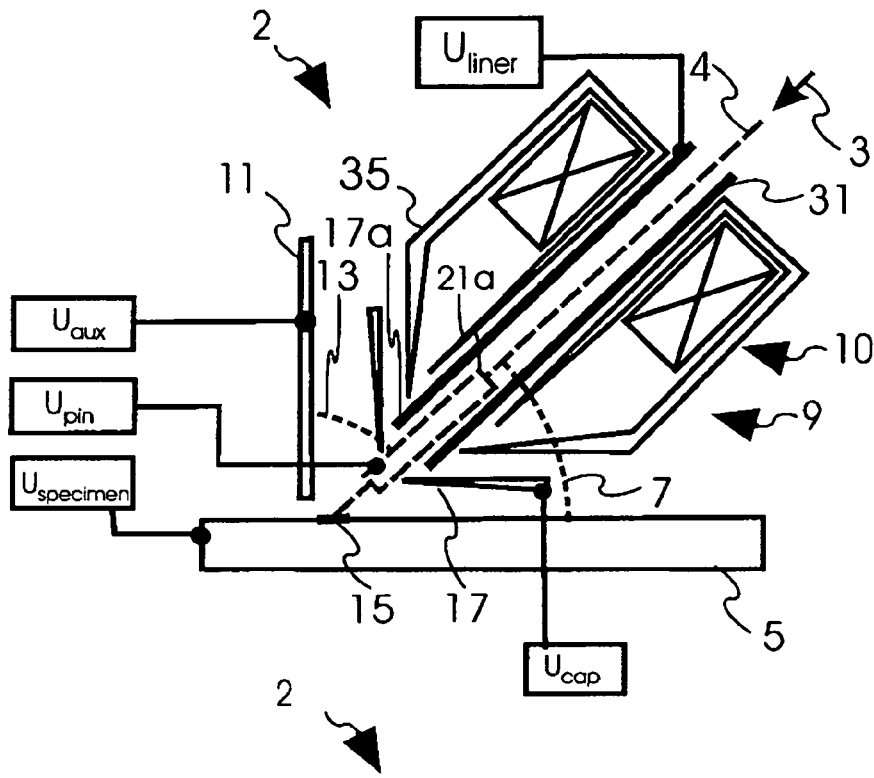
FIG. 3a: A schematic cross sectional side view of a third focusing lens for focusing a charged particle beam onto a specimen having an auxiliary electrode and two correction electrodes.
Figure 3B:
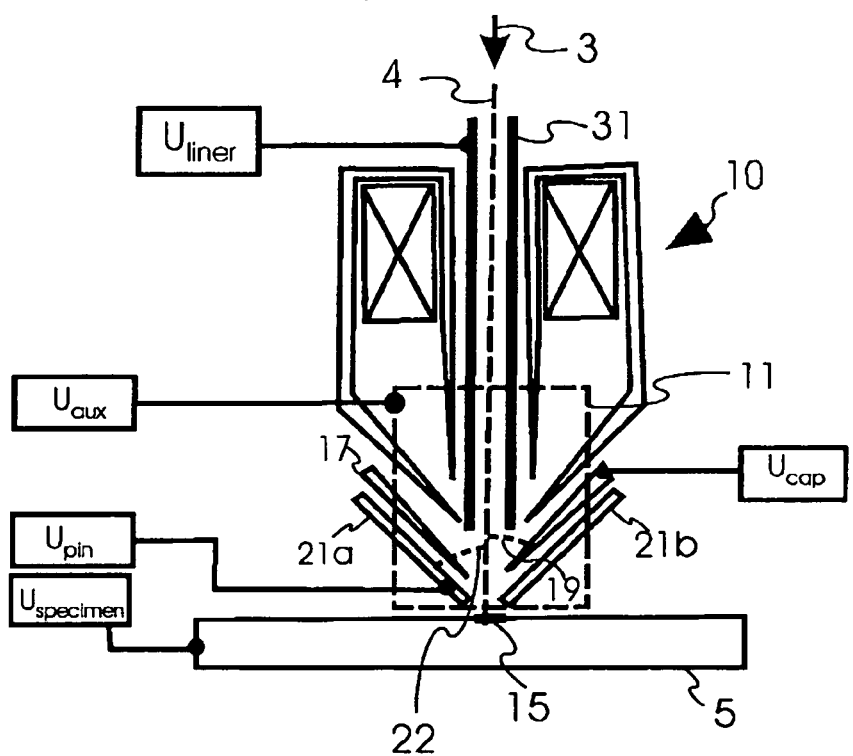
Figure 3C:
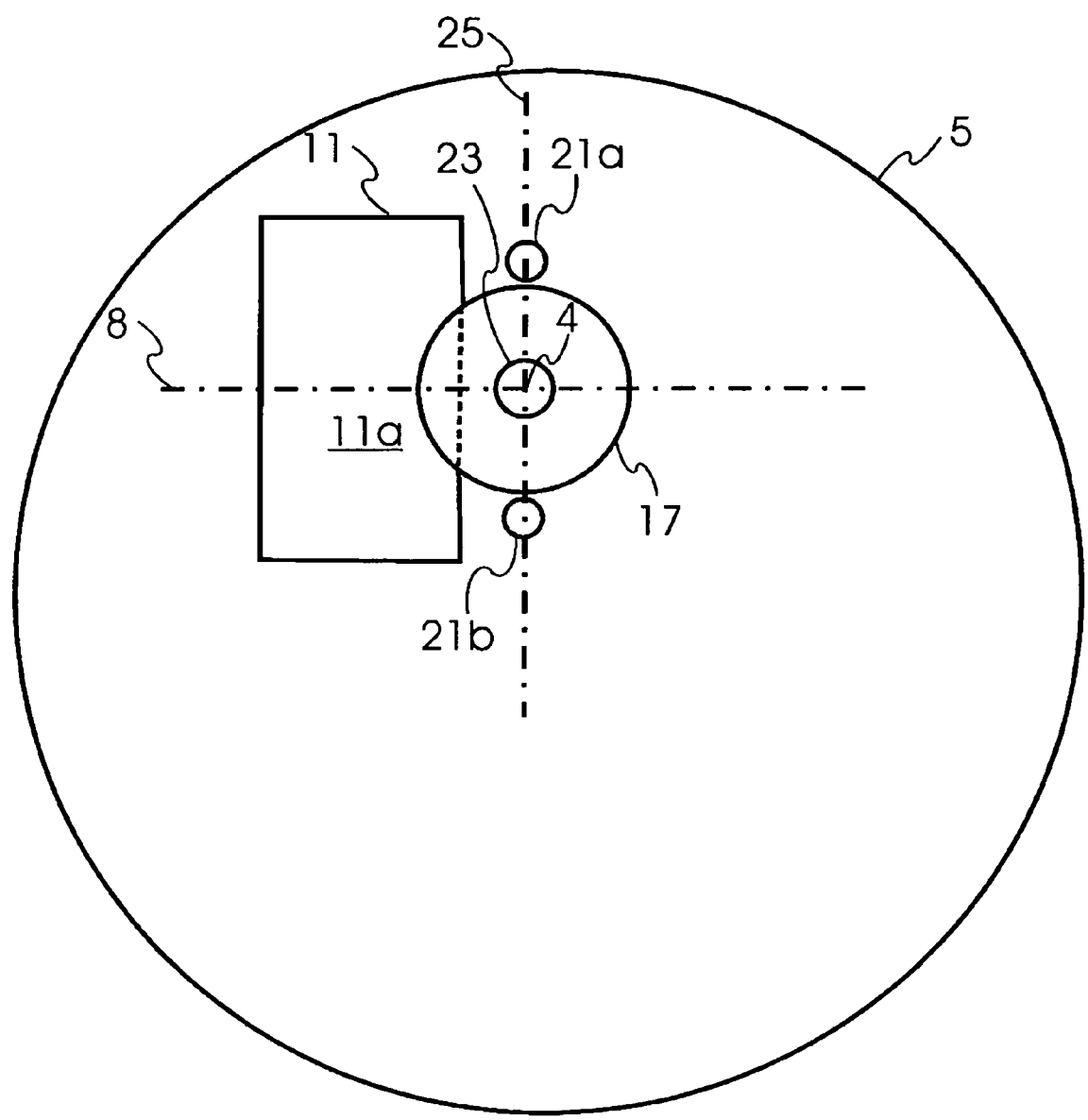
FIG. 3c: A schematic view of the focusing lens of FIGS. 3a and 3b as seen in the direction of the charged particle beam.

FIGS. 3a-c show schematically three different views on a third focusing lens 2 according to the invention. Focusing lens 2 is identical to focusing lens 2 of FIG. 1 with the difference that it includes two pin-like shaped correction electrodes 21a and 21b mounted to opposite sides of first electrode 17. The two pin-like shaped correction electrodes 21a and 21b serve to reduce astigmatism of the charged particle beam 3 caused by specimen 5 facing focusing lens at a tilted landing angle.

FIG. 3a is a cross sectional side view of focusing lens 2 with the cross section cut along tilting plane 8 (see FIG. 3c) to illustrate the tilted landing angle operation at a tilted landing angle 7 of, say, 45 degrees. The view of FIG. 3a is equivalent to the one shown in FIG. 1 except for the additional equally pin-shaped correction electrodes 21a and 21b. Of the two correction electrodes 21a and 21b, only correction electrode 21a is shown since it is lying in front of the other pin-shaped correction electrode 21b. Correction electrode 21a is drawn as a dashed-line object since the correction electrodes 21a and 21b lie outside of tilting plane 8, i.e. first correction electrode 21a lies in front of tilting plane 8, while second correction electrode 21b lies symmetrically thereto behind symmetry plane 8.

In FIGS. 3a-c, the two correction electrodes 21a and 21b are symmetrically aligned with respect to tilting plane 8 and to symmetry plane 25 in order to suppress astigmatism efficiently. Further, the correction electrodes 21a and 21b are each tilted with respect to tilting plane 8 by correction electrode angle 22 in order to provide that the angular point of correction electrode angle 22 preferably coincides with angular point 15 of auxiliary electrode angle 13 (see FIG. 3b). Further, to improve the fourfold symmetry as seen by charged particle beam 3, auxiliary electrode angle 13 equals correction electrode angle 22 within 20% and preferably within 5%. In this way, the two pin-shaped electrodes 21a, 21b point towards the point of interaction where charged particle beam 3 interacts with specimen 5.

FIG. 3b shows a cross section of focusing lens 2 of FIG. 3a cut along the symmetry plane 25 (see FIG. 3c). This view illustrates correction electrode angle 22 included by optical axis 4 and the respective correction electrodes 21a and 21b which in this case, like auxiliary electrode angle 13, is 45 degrees. FIG. 3b further shows a front view of auxiliary electrode 11. Auxiliary electrode 11 is shown as a dashed-lined object since it is positioned in front of symmetry plane 25. Like in FIG. 1, auxiliary electrode 11 is a plate-like structure. In this way, the area of the essentially planar electrode surface 11a facing the optical axis 4 is equivalent to the main surface of the auxiliary electrode 11. Further, the essentially planar electrode surface 11a is symmetrically shaped and positioned with respect to tilting plane 8. Further, the plane defined by the essentially planar electrode surface 11a is positioned to be a reversed image of the surface plane of specimen 5 mirrored by symmetry plane 25.

The area of the essentially planar electrode surface 11a is given by the length and height of auxiliary electrode 11 that is shown in FIG. 3b as dashed lines. Typically, length and height of the essentially planar electrode surface 11a are each at least as long and high as the diameter of the aperture 23 of first electrode 17 in order to provide for a good compensation of the field distortions caused by the tilted specimen surface. Preferably, however, the length and height of the essentially planar electrode surface 11a are at least two times and, even more preferred, at least four times as long and high as the diameter of the aperture 23 of first electrode 17. The plate-like auxiliary electrode 11 of FIGS. 3a-c may be formed of a thin metal plate with the multiple through-holes therein etched or drilled (for simplicity of the drawing, the multiple through-holes 37 are not shown in FIG. 3b). It may be, e.g., glued, screwed or clamped onto first electrode 17, to beam optical column 54 of the charged particle beam device 1, to wall 66 of the specimen chamber that provides the vacuum for the specimen, or to any other suitable support.

FIG. 3c shows schematically a cross section through focusing lens 2 in a plane orthogonal to optical axis 4. The view shows the orientations of auxiliary electrode 11 and correction electrodes 21a, 21b with respect to tilting plane 8 and, orthogonal thereto, symmetry plane 25. Tilting plane 8 and symmetry plane 25 intersect each other along optical axis 4 that extends in a direction normal to the plane of the drawing. Further, symmetry plane 25 is symmetric with respect to correction electrodes 21a and 21b.

FIG. 3c further shows a cross section through cone-like shaped first electrode 17 that defines optical axis 4, to which focusing lens 2 is rotationally symmetric. Note that a portion of auxiliary electrode 11 is drawn with a dashed line to indicate that this portion is hidden by the first electrode 17. FIG. 3c also shows a circular cross section through pin-like shaped correction electrodes 21a and 21b that are attached to the cone-shaped jacket of first electrode 17 at opposite sides of the cone. Further, the pin-shaped correction electrodes 21a, 21b are electrically insulated from first electrode 17 to allow for different voltages for the correction electrodes 21a and 21b and first electrode 17.

The focusing electric field of focusing lens 2 is preferably controlled by voltages that are independently generated by specimen voltage source $U_{specimen}$ connected to specimen 5, first voltage source $U_{cap}$ connected to first electrode 17, second voltage source $U_{liner}$ connected to second electrode 17a, auxiliary voltage source $U_{aux}$ connected to auxiliary electrode 11, and correction voltage source $U_{pin}$ connected to the two correction electrodes 21a and 21b. If said voltage sources are independently adjustable, the focusing electric field can individually be optimized with respect to a desired focusing length, landing angle, landing energy, and the like.

Similar to the embodiment of FIG. 1, the voltages applied to the electrodes of focusing lens 2 strongly depend on the geometry of the focusing lens and the application, e.g. on the energy at which specimen 5 is inspected (landing energy), the required spatial resolution, the beam current of the charged particle beam, and the like. Generally, a skilled person in the field will know what voltages to apply for a given set-up for a given application. Typical voltages applied to the focusing lens 2 of FIGS. 3a-c with respect to specimen 5, when used for a landing energy of a few hundred volts at a spatial resolution of a few ten nanometers, are: +3 kV to first electrode 17; 10 kV to second electrode, zero or a few hundred volts for auxiliary electrode 11 and correction electrodes 21a and 21b and zero volts for specimen 5.

In another embodiment, set-up and operation of a charged particle beam device may be simplified if certain voltages are combined to be controlled by a single voltage source. For example, it may provide a sufficient focusing quality if specimen voltage source $U_{specimen}$, auxiliary voltage source $U_{aux}$, and/or correction voltage source $U_{correction}$ are combined to provide the same voltage to specimen 5, auxiliary electrode 11 and/or the two correction electrodes 21a and 21b. However, if the area of the pin-shaped correction electrodes 21a and 21b facing optical axis 4 is significantly smaller than the area of the essential planar surface 11a of auxiliary electrode 11, it may be necessary to apply a different voltage to the pin-shaped correction electrodes 21a and 21b compared to auxiliary electrode 11 to compensate the astigmatism caused by auxiliary electrode 11. For example, if the primary charged particle beam 3 is an electron beam, the pin-shaped correction electrodes 21a and 21b should be slightly more negative while, if the primary charged particle beam 3 is a positively charged ion beam, the pin-shaped correction electrodes 21a and 21b should be slightly more positive compared to the voltage of auxiliary electrode 11.

Further, if secondary charged particles, e.g. electrons generated by primary charged particle beam 3, are to be detected by an external secondary particle detector 27 positioned behind auxiliary electrode 11, it may be necessary to apply a more positive voltage to auxiliary electrode 11. A higher voltage makes auxiliary electrode 11 capable of drawing the secondary electrons away from the optical axis 4, thereby guiding them through multiple through-holes 37 to secondary charged particle detector 27. A high auxiliary electrode 11 voltage, in turn, may require new voltages for the correction electrodes 21a and 21b in order to optimize the operation with respect to detection efficiency, spatial resolution, and the like. Note that it may also be advantageous to connect independent voltage sources to the two correction electrodes 21a and 21b in order to align the charged particle beam 3.

Figure 4A:
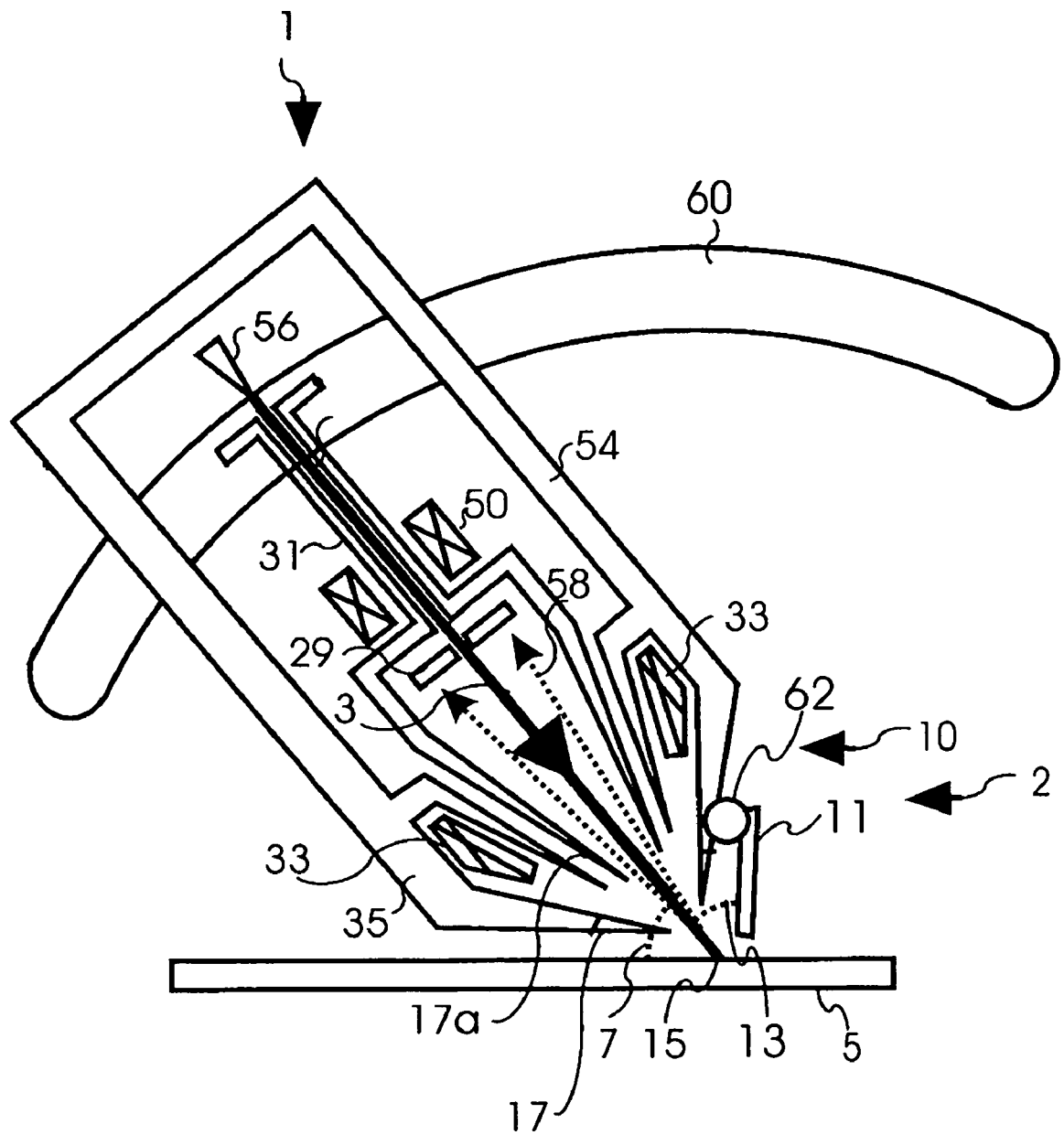
FIG. 4a: A charged particle beam device operated at a tilted landing angle, having a tilting mechanism to change the landing angle of the charged particle beam on the specimen and having auxiliary electrode angle adjustment means to adjust the auxiliary electrode angle to the landing angle.
Figure 4B:
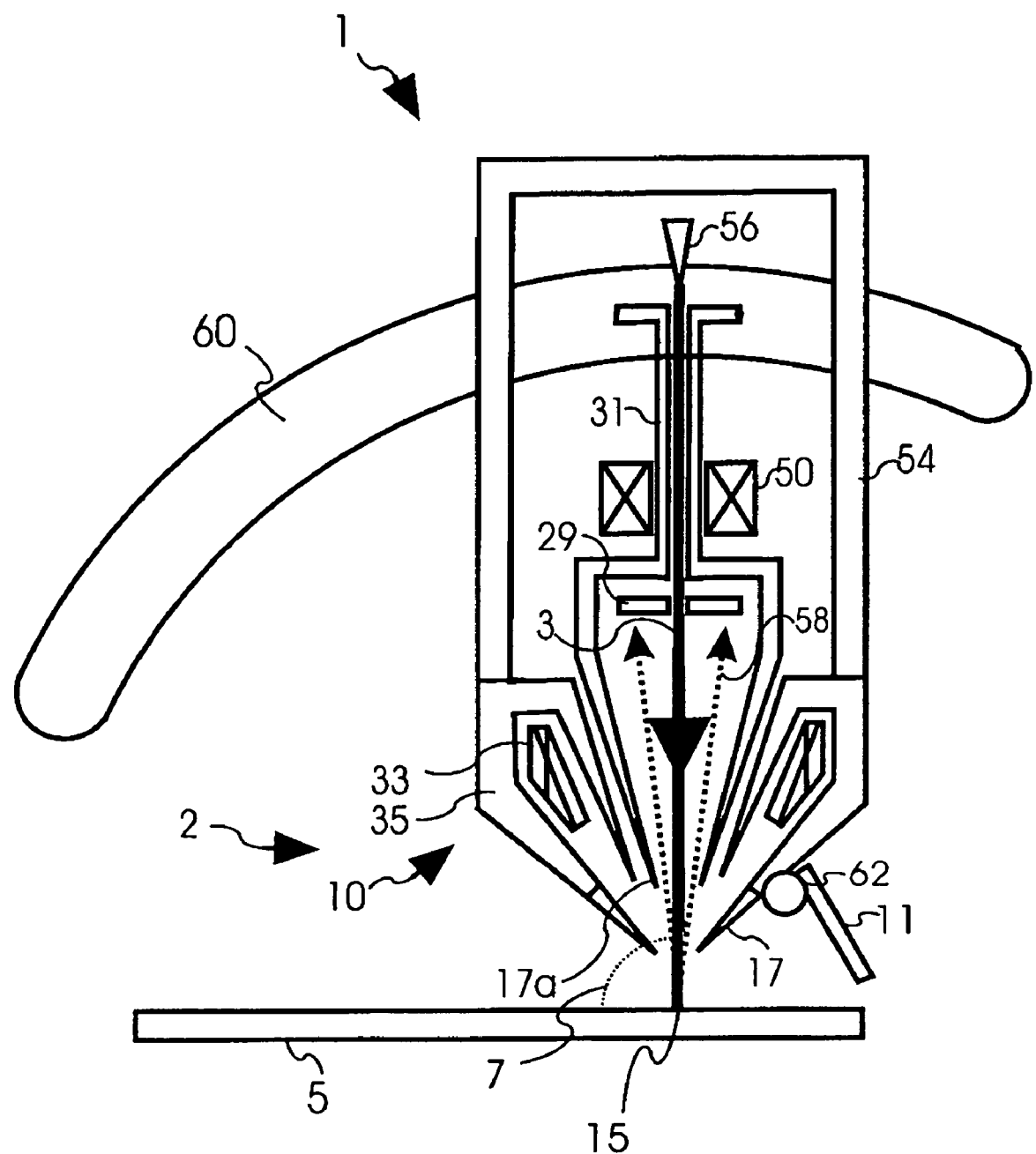
FIG. 4b: The charged particle beam device of FIG. 4a operated at a normal landing angle with the auxiliary electrode moved out of the focusing region.

In another embodiment, FIGS. 4a and 4b schematically disclose a scanning electron microscope (SEM) 1 that can be operated from at least two different landing angles 7. In FIG. 4a, specimen 5 is inspected at a tilted landing angle 7 of 45 degrees while in FIG. 4b, the landing angle is 90 degrees.

Focusing lens 2 is similar to the one described in FIG. 1 and in the article by J. Frosien et al. cited above. SEM 1 has a vacuum-tight housing 54 to provide for a vacuum environment for electron beam 3. The beam optical components include, among others, an electron beam source 56, e.g. one of the well-known thermal field emission emitters or cold field emission emitters that emit electrons into the vacuum; liner tube 31 that is operated at a positive anode voltage, e.g. +8 kV, with respect to the electron beam source 56 to accelerate the emitted electrons towards specimen 5; condenser 50 to either adjust system demagnification or control aperture angle; and liner tube 31 reaching from close to electron beam source 56 to focusing lens 2 where the end portion is used as a second electrode 17a to focus electron beam 3 onto specimen 5.

Focusing lens 2 is comprised of an electric focusing lens formed by first electrode 17 and second electrode 17a, and a magnetic focusing lens 10 comprised of focusing coil 33 and focusing yoke 35. First electrode 17, like in FIG. 1, is connected to first voltage source $U_{cap}$ while second electrode 17a, which is part of liner tube 31, is connected to second voltage source $U_{liner}$. Typically, second voltage $U_{liner}$ is operated within a range of 5 kV to 20 kV with respect to particle source 56 to accelerate electron beam 3 to a high energy, while first voltage $U_{cap}$ is between 0 to 5 kV. In this way, a strong focusing field can be generated between first electrode 17 and second electrode 17a to provide for a short focusing length.

FIGS. 4a and 4b also disclose an auxiliary electrode 11 like the one shown in FIG. 1 and FIGS. 3a-c. Auxiliary electrode 11 is mechanically connected to first electrode 17 by auxiliary electrode angle adjustment means 62. Auxiliary electrode angle adjustment means 62 are capable of moving tilting auxiliary electrode 11 in a way that the essentially planar electrode surface 11a of auxiliary electrode 11 can be rotated around angular point 15, the point where optical axis 4 intersects with specimen 4. In this way, it is possible to adjust the auxiliary electrode angle 13 to various given landing angle 7. In another embodiment, auxiliary electrode angle adjustment means 62 are equipped with a motor to remotely adjust the auxiliary electrode angle 13 to a given landing angle 7. In yet another embodiment, a control unit may be used to synchronize the adjustment of the auxiliary electrode angle 13 to a given landing angle 7. In yet another embodiment, note that during an orthogonal landing angle beam operation as shown in FIG. 4b, auxiliary electrode angle adjustment means 62 can rotate auxiliary electrode 11 away from the focusing region to not disturb the focusing quality. This is since with a landing angle of 90 degrees, perfect rotational symmetry with respect to optical axis 4 is only provided with auxiliary electrode 11 moved out of the way.

FIGS. 4a-b also show schematically an example for a tilting mechanism 60 that facilitates the tilting of focusing lens 2 and its beam optical column with respect to specimen 5. The design of tilting mechanism 60 may vary widely. Depending on the application, a person skilled in the art will know how to design the details of the tilting mechanism 60. In particular, a skilled person will also know that a tilted beam operation can be achieved by tilting specimen 5 with respect to SEM 1, by tilting the specimen 5 with respect to SEM 1, by tilting both, or by deflecting the charged particle beam 3. Also, it should be noted that for some applications, inspection or structuring of a specimen can be carried out with only one tilting angle. In this case, it may be cost efficient to have a charged particle beam device with the tilting mechanism 60 omitted.

Note that SEM 1 in FIGS. 4a-b has an internal secondary particle detector 29 to detect secondary particles 58 that are generated by electron beam 3 on specimen 5. Internal secondary particle detector 29 is placed within liner tube 31 since this way, secondary and/or backscattered electrons emitted from the specimen can be efficiently detected. This is because the positive second voltage $V_{liner}$ of liner tube 31 can accelerate secondary and/or backscattered electrons away from specimen 5 and guide them through focusing lens 2 to the detector.

Figure 5:
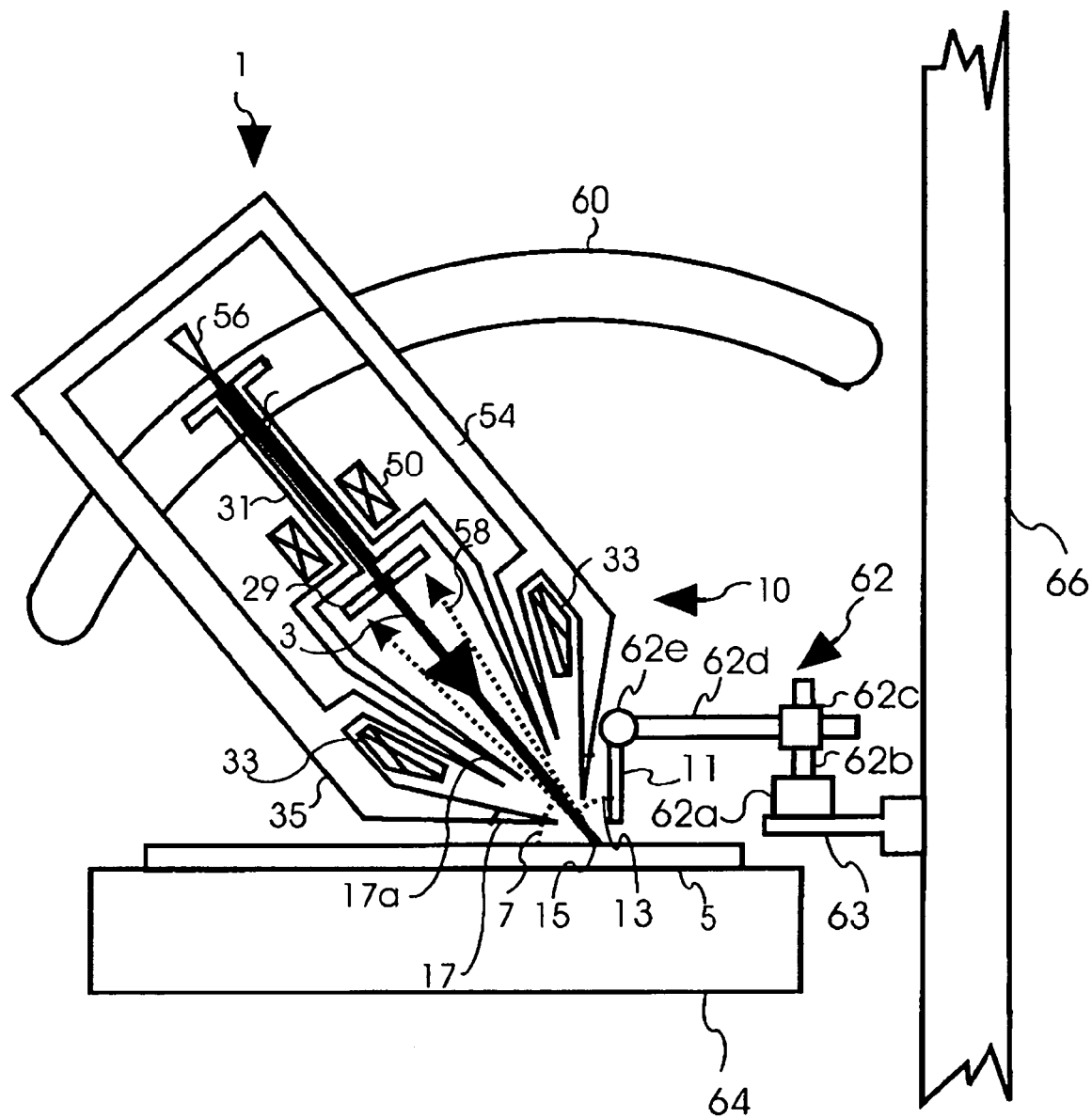
FIG. 5: The charged particle beam device of FIG. 4a having the auxiliary electrode angle adjustment means mounted to the specimen chamber.

FIG. 5 discloses the same SEM 1 as shown in FIGS. 4a-b with the difference that auxiliary electrode adjustment means 62 are not fastened to first electrode 17 but to a wall element of specimen chamber 66. Specimen chamber 66 is the chamber that encloses the specimen region to provide a vacuum therein during beam operation. Fastening auxiliary electrode adjustment means 62 to specimen chamber 66 has the advantage that auxiliary electrode 11 can be completely moved out of the focusing region when operating SEM 1 at a landing angle of 90 degrees. In another embodiment, no electric insulation between first electrode 17 and auxiliary electrode 11 is required in the small and highly sensitive focusing region between first electrode 17 and specimen 5.

The structure of auxiliary electrode adjustment means 62 in FIG. 5 is mounted onto a support table 63 which is in rigid connection with the wall element of the specimen chamber 66. Auxiliary electrode adjustment means 62 are comprised of a motorized turntable 62a to rotate an axle 62b that can turn auxiliary electrode 11 in or out of the focusing region, and of holding lever 62d to hold auxiliary electrode 11 in a position close to first electrode 17. Axle 62b and holding lever 62d enclose an angle of about 90 degrees. Both are connected by means of a motorized linear drive 62c in order to adjust the radial distance between axle 62b and auxiliary electrode 11. In another embodiment, holding lever 62d and auxiliary electrode 11 are connected by means of a motorized swivel joint 62e to be able to adjust the auxiliary electrode angle 13 to a given landing angle 7.

While it is possible that turntable 62a, linear drive 62c and swivel joint 62e are operable manually, it is preferred that at least one of the three is motorized. In this way, it is possible to automatically adjust the auxiliary electrode angle 13 to a given landing angle 7. Further note that, depending on the application, it may be advantageous to mount auxiliary electrode adjustment means 62 to places different from the specimen chamber. For example, the auxiliary electrode adjustment means 62 may be mounted to beam optical column 54 of the charged particle beam device 1 or any other structure suitable for holding the auxiliary electrode 11. Also, a skilled person will appreciate that the positioning of auxiliary electrode 11 by the auxiliary electrode adjustment means 62 of FIG. 5 or 4a-b can be achieved in many different ways, e.g. by a structure having single x-y-z table to move the auxiliary electrode 11 towards first electrode 17 and a swivel joint to adjust the electrode angle 13.

In another embodiment, a method for focusing a charged particle beam 3 onto a specimen 5 at a tilted landing angle 7 may include the following steps:

(a) focusing the charged particle beam 3, e.g. an electron or ion beam, onto the specimen at a tilted landing angle 7. The specimen may be, for example, a semiconductor wafer;

(b) providing for an auxiliary electrode 11 having an essentially planar electrode surface 11a for focusing the charged particle beam at a tilted landing angle 7. The auxiliary electrode 11 may be e.g. a metal plate or any other electrically conducting structure that has a planar electrode surface 11a; and (c) providing for an auxiliary electrode angle 13 included by the charged particle beam 3 and the electrode surface 11a that essentially equals the tilted landing angle 7.

Providing for an auxiliary electrode angle that essentially equals the landing angle can be achieved in different ways. In one example, auxiliary electrode 11 is rigidly fastened to a focusing lens 2 to provide for a fixed auxiliary electrode angle 13. In this case, auxiliary electrode angle 13 can be made to equal landing angle 7 by tilting the focusing lens 2 with respect to the specimen 5, e.g. by tilting the beam optical column 54 using tilting mechanism 60 (see FIGS. 4a-b) or by tilting the specimen 5. This method is preferred if a charged particle beam device is used to inspect or structure a specimen at the fixed tilted landing angle.

In another example, auxiliary electrode 11 is held in position by auxiliary electrode angle adjustment means 62 that are capable of rotating auxiliary electrode 11 around angular point 15 where optical axis 4 intersects with specimen 5 (see FIGS. 4a-b). In this case, auxiliary electrode angle 13 may be actively adjusted to match a given landing angle 7. This allows for a high precision operation at many different landing angles 7. In this case, it is preferred to have a control unit that automatically adjusts auxiliary electrode angle 13 to any given landing angle 7. An automatic adjustment usually requires some sort of motor that initiates the rotation to tilt auxiliary electrode 11 with respect to optical axis 4. A skilled person knows what mechanics and what motors or drive to take depending on the type of focusing lens, the space available for placing the motor at the focusing lens, and the range of landing angles at which the focusing lens is to be operated. Note that auxiliary electrode angle adjustment means 62 should have a mechanism to move auxiliary electrode 11 away from the focus of charged particle beam 3 in order not to disturb the focusing electric field when operating the focusing lens at a vertical (non-tilted) landing angle. Further note that auxiliary electrode angle adjustment means 62 may be connected to focusing lens 2, to specimen chamber 66, to beam optical column 54, or to any other location of the charged particle beam device that is appropriate for holding auxiliary electrode 11.

It should be noted that the auxiliary electrode 11 is used to define an essentially planar equipotential region that intersects the specimen at an intersection angle that is about twice the landing angle 7. This way, if the potential of the essentially planar equipotential region equals the potential of the specimen 5, a symmetry of the focusing electric field in the region of the charged particle beam can be obtained that eliminates any deflecting effects to the charged particle beam that otherwise would distort the beam focus.

It should further be noted that the meaning of "the auxiliary electrode angle essentially equals the tilted landing angle" indicates that the best focusing performance is achieved if auxiliary electrode angle and tilting angle are exactly equal. However, an improvement of the focusing performance over no auxiliary electrode 11 at all is also achieved if the auxiliary electrode angle deviates from the landing angle. It is therefore generally preferred that the auxiliary electrode angle deviates from the landing angle by less 20 degrees, preferably by less than 10 degrees and even more preferred by less than 5 degrees. Similarly, it is preferred that the at least two correction electrodes 21a and 21b have the same correction electrode angle 22 with respect to tilting plane 8 within 20 degrees, preferably within 10 degrees and even more preferred within 5 degrees.

Similarly, the meaning of "the angular point of the auxiliary electrode angle coincides with the angular point of the landing angle" indicates that the best focusing performance is achieved if the angular point of the electrode and point of interaction coincide completely. However, an improvement of the focusing performance over no auxiliary electrode is also achieved if the coincidence is not complete. It is therefore generally preferred that the angular point of the auxiliary electrode angle deviates from the angular point of the landing angle by less than the focusing length at which the charged particle beam is focused, preferably by less than half of the focusing length and even more preferred by less than one tenth of the focusing length.

It should further be emphasized that the embodiments shown in the figures represent only non-limiting examples of the present invention. It should be clear that a skilled person knows that the different features shown in the different embodiments can be combined in many different ways without leaving the spirit of the invention. For example, depending on the application, any of the focusing lenses 2 shown in the figures can be equipped with an auxiliary electrode 11 that has multiple through-holes, or not. Further depending on the application, any of the focusing lenses 2 can be equipped with the at least two correction electrodes 21a and 21b, or not, to further reduce higher order beam distortions. Similarly, any of the focusing lenses 2 can be equipped with a magnetic focusing lens 10, or not, or with a liner tuber 31, and so on.

I claim:

1. A focusing lens for focusing a charged particle beam onto a specimen comprising:
    an auxiliary electrode having an essentially planar electrode surface for focusing the charged particle beam at a tilted landing angle, wherein the essentially planar electrode surface has an auxiliary electrode angle with an optical axis of the focusing lens which is smaller than 80 degrees.

2. The focusing lens of claim 1, wherein the auxiliary electrode angle is smaller than 60 degrees.

3. The focusing lens of claim 1, wherein the auxiliary electrode angle is larger than 20 degrees.

4. The focusing lens of claim 1, further comprising a first electrode having an aperture for focusing the charged particle beam.

5. The focusing lens of claim 4, wherein the essentially planar electrode surface of the auxiliary electrode is oriented to face the first electrode.

6. The focusing lens of claim 4, wherein the essentially planar electrode surface within a first direction is longer than a diameter of the aperture of the first electrode by at least a factor of one.

7. The focusing lens of claim 6, wherein the essentially planar electrode surface within a second direction that is orthogonal to the first direction, is longer than the diameter of the aperture of the first electrode by at least a factor of one.

8. The focusing lens of claim 4, wherein in all directions, macroscopic curvature radii of the essentially planar electrode surface are larger than a curvature radius of the aperture of the first electrode by a factor larger than 10.

9. The focusing lens of claim 1, wherein the essentially planar electrode surface is aligned to be orthogonal with respect to a tilting plane extending along the optical axis.

10. The focusing lens of claim 9, wherein the essentially planar electrode surface is aligned to be symmetric with respect to the tilting plane.

11. The focusing lens of claim 4, wherein the auxiliary electrode is mechanically attached to the first electrode.

12. The focusing lens of claim 1 further comprising mechanical means for rotating the auxiliary electrode to adjust the auxiliary electrode angle to an actual landing angle.

13. The focusing lens of claim 1, wherein the auxiliary electrode has a plurality of multiple through-holes for secondary charged particles to pass through the auxiliary electrode.

14. The focusing lens of claim 4, further comprising a second electrode, wherein the second electrode is positioned upstream of the first electrode for focusing the charged particle beam.

15. The focusing lens of claim 14, further comprising a third electrode, wherein the third electrode is positioned upstream of the second electrode for focusing the charged particle beam.

16. The focusing lens of claim 4, wherein at least one element selected from a group consisting of the first electrode, the second electrode and the third electrode is rotationally symmetric with respect to the optical axis.

17. The focusing lens of claim 4, wherein at least one element selected from a group consisting of the first electrode, the second electrode and the third electrode is cone-like shaped.

18. The focusing lens of claim 17, wherein at least one element selected from a group consisting of the cone-like shaped first electrode, the cone-like shaped second electrode and the cone-like shaped third electrode has an apex half-angle, which is equal or smaller than the auxiliary electrode angle.

19. The focusing lens of claim 1, further comprising a magnetic focusing lens for focusing the charged particle beam.

20. The focusing lens of claim 19, wherein the magnetic focusing lens, further comprises a focusing yoke for focusing the charged particle beam by a magnetic field.

21. The focusing lens of claim 1, further comprising at least two correction electrodes for reducing a quadrupole field generated by the auxiliary electrode.

22. The focusing lens of claim 21, wherein each of the at least two correction electrodes are shaped and positioned to be symmetric with respect to a tilting plane extending along the optical axis.

23. The focusing lens of claim 21, wherein the at least two correction electrodes are shaped and positioned to be symmetric with respect to a symmetry plane extending along the optical axis.

24. The focusing lens of claim 23, wherein the tilting plane is essentially orthogonal to the symmetry plane.

25. The focusing lens of claim 21, wherein the at least two correction electrodes are tilted with respect to the tilting plane by a correction electrode angle.

26. The focusing lens of claim 25, wherein an angular point of the correction electrode angle coincides with an angular point of an auxiliary electrode angle.

27. The focusing lens of claim 21, wherein the at least two correction electrodes are pin-like shaped.

28. The focusing lens of claim 21, wherein the at least two correction electrodes are attached to a first electrode.

29. The focusing lens of claim 1, further comprising:
a specimen voltage source that is connected to the specimen;
a first electrode that is connected to a first voltage source;
a second electrode that is connected to a second voltage source;
a third electrode that is connected to a third voltage source;
the auxiliary electrode that is connected to an auxiliary voltage source; and
the at least two correction electrodes are connected to a correction voltage source for controlling the voltages independently from each other.

30. The charged particle beam device of claim 29, wherein at least one voltage source selected from the group consisting of the first voltage source, the second voltage source, the third voltage source, the auxiliary voltage source and the correction voltage source applies its respective voltage with respect to the voltage of the specimen voltage source.

31. The focusing lens of claim 21, wherein the specimen, the auxiliary electrode, the at least two correction electrodes, and a first electrode are electrically connected with each other to be at the same voltage.

32. The focusing lens of claim 1, further comprising a charged particle beam device for focusing a charged particle beam onto a specimen.

33. A charged particle beam device for focusing a charged particle beam focusing onto a specimen comprising:
a focusing lens for focusing the charged particle beam onto the specimen; and
an auxiliary electrode having an essentially planar electrode surface for focusing the charged particle beam at a tilted landing angle, wherein the essentially planar electrode surface has an auxiliary electrode angle with an optical axis of the focusing lens which essentially equals the landing angle.

34. The charged particle beam device of claim 33, wherein the auxiliary electrode angle is smaller than 80 degrees.

35. The charged particle beam device of claim 33, wherein the focusing lens is oriented to provide that the auxiliary electrode angle and the landing angle both lie within a tilting plane.

36. The charged particle beam device of claim 33, wherein the auxiliary electrode angle equals the landing angle within 20 degrees.

37. The charged particle beam device of claim 33, wherein the focusing lens is positioned to provide that an angular point of the auxiliary electrode angle essentially coincides with the point of interaction with the specimen.

38. The charged particle beam device of claim 33, further comprising a tilting mechanism for focusing the charged particle beam onto the specimen at different landing angles.

39. The charged particle beam device of claim 33, further comprising auxiliary electrode angle adjustment means for adjusting the auxiliary electrode angle to the landing angle.

40. The charged particle beam device of claim 33, further comprising a control unit, wherein the control unit is connected to the auxiliary electrode angle adjustment means and to a tilting mechanism for automatically adjusting the auxiliary electrode angle to a given landing angle.

41. A method of focusing a charged particle beam onto a specimen, comprising the act of:
focusing the charged particle beam onto the specimen at a tilted landing angle;
providing for an auxiliary electrode having an essentially planar electrode surface; and
providing for an auxiliary electrode angle formed by the charged particle beam and the essentially planar electrode surface that essentially equals the tilted landing angle.

42. The focusing method of claim 41, further comprising the act of providing that the auxiliary electrode angle and the tilted landing angle lie within a tilting plane.

43. The focusing method of claim 41, further comprising the act of moving the auxiliary electrode with respect to the specimen to provide that the angular point of the auxiliary electrode angle essentially coincides with the tilted landing angle.

44. The focusing method of claim 41, wherein a desired auxiliary electrode angle is provided by rotating the auxiliary electrode with respect to a direction of the charged particle beam.

45. The focusing method of claim 41, wherein the desired auxiliary electrode angle is provided by moving the auxiliary electrode with respect to the specimen.

46. A method of focusing a charged particle beam onto a specimen, comprising the act of:
focusing the charged particle beam onto the specimen at a tilted landing angle; and
generating an essentially planar equipotential region oriented to intersect the specimen at an intersection angle that is essentially twice the tilted landing angle.

47. The focusing method of claim 46, wherein the intersection angle lies essentially within the same plane as the tilted landing angle.

48. The focusing method of claim 46, wherein the essentially planar equipotential region intersects the specimen at an angular point of the landing angle.

49. The focusing method of claim 46, wherein the potential of the essentially planar equipotential region equals the potential of the specimen.

50. The focusing method of claim 46, wherein the essentially planar equipotential region is generated by an essentially planar electrode surface of an auxiliary electrode.

51. The focusing method of claim 46, wherein a tilted landing angle is provided by changing the landing angle.

52. The focusing method of claim 46, wherein the landing angle is smaller than 80 degrees.

53. The focusing method of claim 46, wherein the landing angle is larger than 10 degrees.

54. The focusing method of claim 46, wherein the specimen and an auxiliary electrode are connected to a same specimen voltage source to have the same voltage.

55. The focusing method of claim 46, wherein the charged particle beam is focused by a focusing lens that comprises an auxiliary electrode having an essentially planar electrode surface for focusing the charged particle beam at a tilted landing angle, wherein the essentially planar electrode surface has an auxiliary electrode angle with an optical axis of the focusing lens which is smaller than 80 degrees.

* * * * *

UNITED STATES PATENT AND TRADEMARK OFFICE
CERTIFICATE OF CORRECTION

PATENT NO. : 7,326,927 B2 Page 1 of 1
APPLICATION NO. : 11/249772
DATED : February 5, 2008
INVENTOR(S) : Jürgen Frosien It is certified that error appears in the above-identified patent and that said Letters Patent is hereby corrected as shown below:

On the title page Item (54) and col. 1, line 2, Delete "TITLED" and insert --TILTED--.

Signed and Sealed this

First Day of July, 2008

JON W. DUDAS
*Director of the United States Patent and Trademark Office*